United States Patent
Yen et al.

(10) Patent No.: US 9,455,156 B2
(45) Date of Patent: Sep. 27, 2016

(54) METHOD OF MAKING A SEMICONDUCTOR DEVICE USING MULTIPLE LAYER SETS

(71) Applicant: TAIWAN SEMICONDUCTOR MANUFACTURING COMPANY, LTD., Hsinchu (TW)

(72) Inventors: Bi-Ming Yen, Hsinchu (TW); Tsai-Chun Li, Hsinchu (TW); Chun-Ming Hu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/863,904

(22) Filed: Sep. 24, 2015

(65) Prior Publication Data

US 2016/0013071 A1    Jan. 14, 2016

Related U.S. Application Data

(63) Continuation of application No. 13/714,756, filed on Dec. 14, 2012, now Pat. No. 9,159,580.

(51) Int. Cl.
| | |
|---|---|
| *H01L 21/311* | (2006.01) |
| *H01L 21/768* | (2006.01) |
| *H01L 21/02* | (2006.01) |
| *H01L 21/027* | (2006.01) |

(52) U.S. Cl.
CPC ..... *H01L 21/31144* (2013.01); *H01L 21/0276* (2013.01); *H01L 21/02118* (2013.01); *H01L 21/02123* (2013.01); *H01L 21/31111* (2013.01); *H01L 21/31116* (2013.01); *H01L 21/31133* (2013.01); *H01L 21/31138* (2013.01); *H01L 21/76816* (2013.01)

(58) Field of Classification Search
CPC .......... H01L 21/31116; H01L 21/31138; H01L 21/31144; H01L 21/76816
See application file for complete search history.

(56) References Cited

U.S. PATENT DOCUMENTS

| | | |
|---|---|---|
| 4,814,041 A | 3/1989 | Auda |
| 5,753,418 A | 5/1998 | Tsai et al. |
| 6,350,675 B1 | 2/2002 | Chooi et al. |
| 6,774,032 B1 | 8/2004 | Park |
| 7,799,511 B2 | 9/2010 | Chou et al. |
| 8,168,374 B2 | 5/2012 | Chou et al. |
| 9,159,580 B2* | 10/2015 | Yen .............. H01L 21/31116 |
| 2003/0129539 A1 | 7/2003 | Tsai et al. |
| 2003/0134231 A1 | 7/2003 | Tsai et al. |

(Continued)

*Primary Examiner* — Marvin Payen
*Assistant Examiner* — Victor Barzykin
(74) *Attorney, Agent, or Firm* — Haynes and Boone, LLP

(57) ABSTRACT

A method of making a semiconductor device includes forming an intermediate semiconductor device. The intermediate device includes a substrate; and a dielectric layer over the substrate. The intermediate device includes a first layer set, including a silicon-rich photoresist material, over the dielectric layer. The intermediate device includes a second layer set, including a carbon-rich organic material layer, over the first layer set. The method further includes etching the second layer set to form a tapered opening in the second layer set. The method further includes etching the first layer set to form an opening in the first layer set, wherein etching the first layer set comprises removing the carbon-rich organic material layer. The method further includes etching the dielectric layer using the first layer set as a mask to form an opening in the dielectric layer, wherein etching the dielectric layer comprises reducing a thickness of the first layer set.

20 Claims, 5 Drawing Sheets

(56) References Cited

U.S. PATENT DOCUMENTS

| | | |
|---|---|---|
| 2004/0009662 A1 | 1/2004 | Park et al. |
| 2004/0087153 A1 | 5/2004 | Du et al. |
| 2006/0000796 A1 | 1/2006 | Tan et al. |
| 2006/0046495 A1 | 3/2006 | Frohberg et al. |
| 2007/0010099 A1 | 1/2007 | Du et al. |
| 2008/0064203 A1 | 3/2008 | Chou et al. |
| 2008/0248429 A1 | 10/2008 | Chou et al. |
| 2009/0035944 A1 | 2/2009 | Chiang et al. |
| 2009/0314743 A1 | 12/2009 | Ma |
| 2010/0304569 A1 | 12/2010 | Chou et al. |
| 2011/0174774 A1 | 7/2011 | Lin et al. |
| 2012/0161327 A1 | 6/2012 | Chumakov et al. |
| 2012/0184105 A1 | 7/2012 | Chou et al. |
| 2012/0244710 A1 | 9/2012 | Chumakov et al. |
| 2012/0302056 A1 | 11/2012 | Chen et al. |
| 2012/0315748 A1 | 12/2012 | Chang et al. |
| 2013/0137269 A1 | 5/2013 | Geiss et al. |

* cited by examiner

METHOD OF MAKING A SEMICONDUCTOR DEVICE USING MULTIPLE LAYER SETS

PRIORITY CLAIM

This application is a continuation of U.S. application Ser. No. 13/714,756, filed Dec. 14, 2012, which is incorporated herein by reference in its entirety.

RELATED APPLICATIONS

This application is related to U.S. application Ser. No. 13/686,413, entitled "METHOD OF MAKING A SEMICONDUCTOR DEVICE USING A BARRIER AND ANTI-REFLECTIVE COATING (BARC) LAYER", filed on Nov. 27, 2012, which is hereby incorporated by reference in its entirety.

BACKGROUND

As technology nodes shrink more emphasis is placed on the ability to reduce the distance between features in a semiconductor device. Reducing the distance between features is limited by the uniformity of the features in the semiconductor device because of the risk of short circuits forming between adjacent features. A minimum distance between features to have an acceptable risk of short circuits is called a critical dimension. Processes which yield a highly uniform feature facilitate smaller critical dimensions. Processes which yield features having low uniformity result in larger critical dimensions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
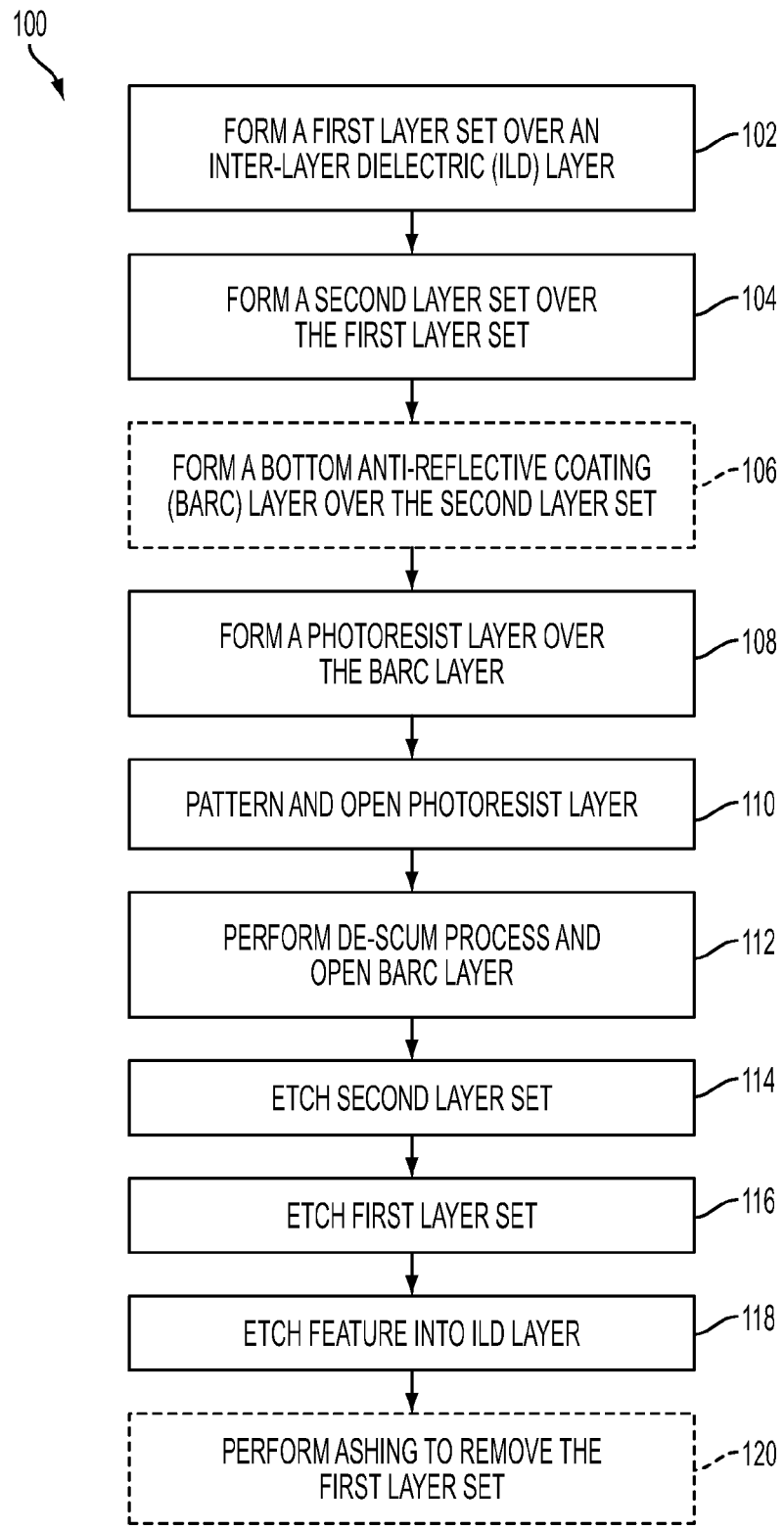
FIG. 1 is a flow chart for a method of patterning a semiconductor device using multiple layer sets, in accordance with one or more embodiments.
Figure 2A:
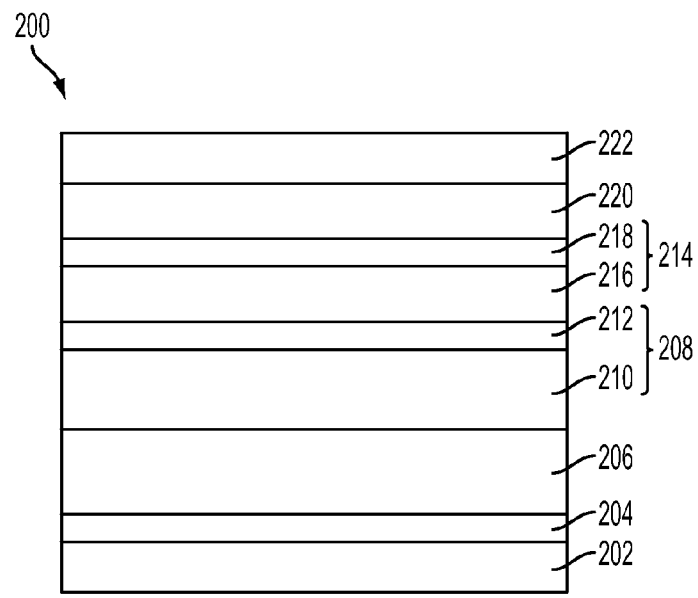
FIGS. 2A-2G are cross-sectional views of the semiconductor device during various points of the method of FIG. 1, in accordance with one or more embodiments.
Figure 2B:
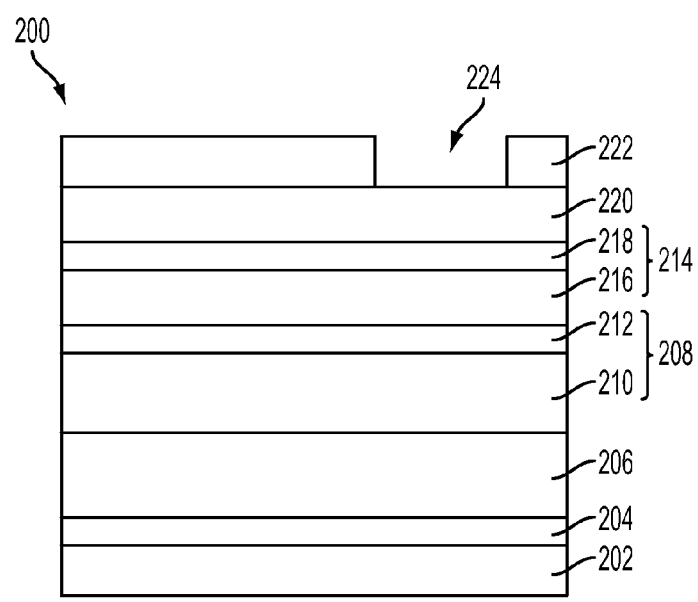
Figure 2C:
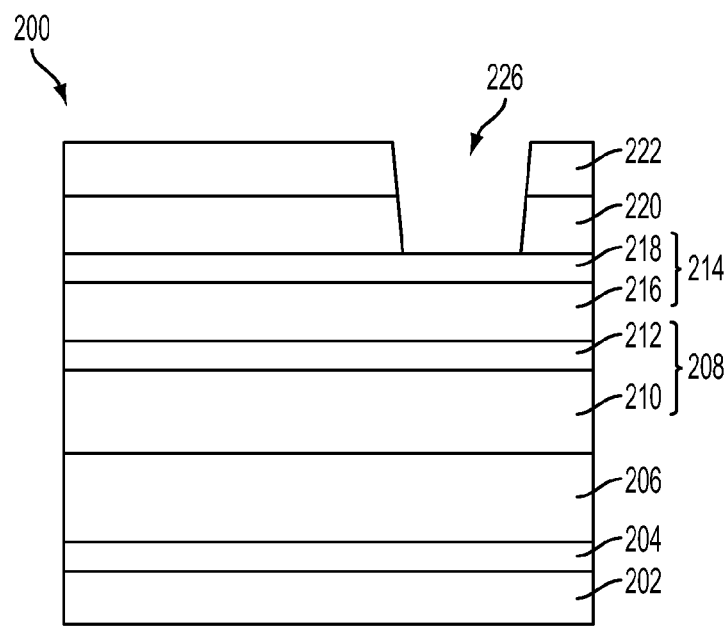
Figure 2D:
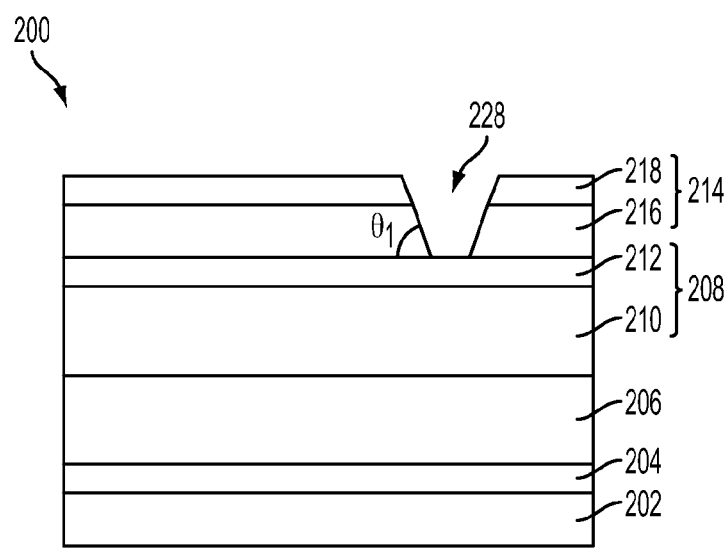
Figure 2E:
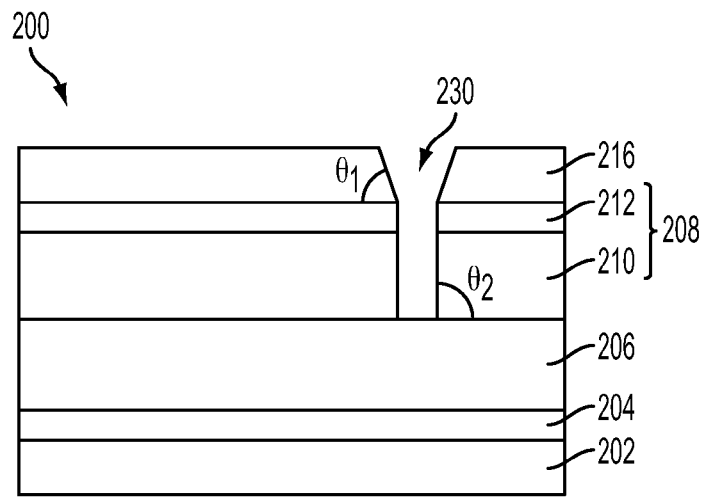
Figure 2F:
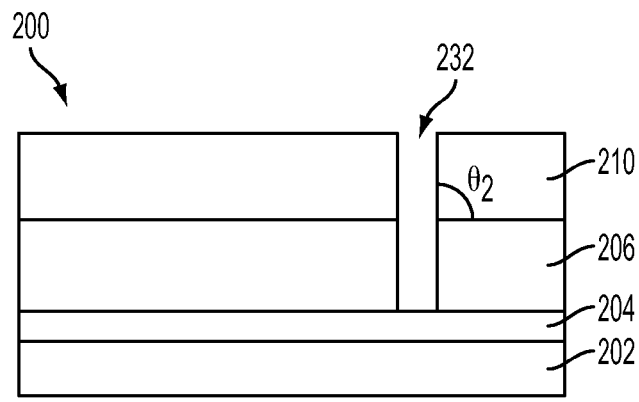
Figure 2G:
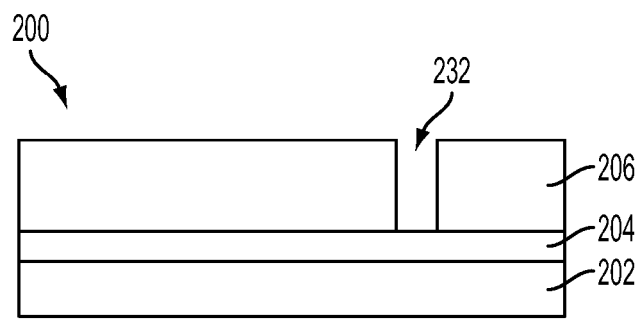

FIGS. 1-2G are directed to the formation of a single feature; however, one of ordinary skill in the art would recognize the process is usable to form a plurality of similar features simultaneously. The embodiments of FIGS. 1-2G are directed to two layer sets. In some embodiments, more than two layer sets are used. As the number of layer sets increases, controlling a critical dimension of features formed in an inter-layer dielectric layer becomes more difficult.

Electrical interconnections between various components of the semiconductor device are formed within an inter-layer dielectric (ILD) layer. The ILD layer is etched to create openings, such as holes or trenches, for features which are later metalized in order to provide a conductive path for electrical signals to connect the various components. The uniformity of the openings etched into the ILD layer factors into a determination of how closely packed the openings are able to be formed to avoid short circuits forming between adjacent metalized features. In some techniques, the uniformity of the openings is measured using a line width roughness (LWR) parameter. As the LWR parameter increases, the critical dimension also increases in order to prevent short circuits. In some techniques, a single layer set deposited over the ILD layer is used to define a pattern for the openings in the ILD layer during the etching process.

Another factor which influences the critical dimension is a wavelength of a light source used during a lithography process. As the wavelength of the light source decreases, the critical dimension also decreases. However, as the wavelength of the light source increases the LWR parameter increases partially counteracting the reduced critical dimension.

Line width roughness (LWR) is a parameter used to measure uniformity of a feature. LWR is calculated by measuring a width of a plurality of features at several points along each feature. The measured widths are then averaged to obtain an average feature width. LWR is the difference between a largest measured width and the average feature width. As the number of features measured or the number of points measured along each feature increases, the accuracy of the LWR measurement increases. However, the increased number of measurements will also increase processing time.

LWR impacts the critical dimension of semiconductor devices because features having a low LWR are capable of being more densely placed in a semiconductor device. The uniformity of features in a semiconductor device facilitates more accurate modeling of the separation between features to achieve a desired resistance and capacitance performance mitigating a need to account for as large of an amount of manufacturing error.

FIG. 1 is a flow chart of a method 100 of patterning a semiconductor device using a dual layer set, in accordance with one or more embodiments. Method 100 begins with step 102 in which a first layer set is formed over an inter-level dielectric (ILD) layer. In some embodiments, the first layer set comprises a plurality of layers. In some embodiments, each layer of the first layer set is formed using a same process, e.g., physical vapor deposition (PVD), atomic layer deposition (ALD), sputtering, chemical vapor deposition (CVD) or other suitable processes. In some embodiments having a plurality of layers, at least one layer of the first layer set is formed by a different process than at least another layer of the first layer set.

Method 100 continues with step 104 in which a second layer set is formed over the first layer set. In some embodiments, the second layer set is deposited using PVD, CVD, ALD sputtering or other suitable processes. In some embodiments, the second layer set comprises a plurality of layers. In some embodiments, each layer of the second layer set is formed using the same process. In some embodiments having a plurality of layers, at least one layer of the second layer set is formed by a different process than at least another layer of the second layer set. In some embodiments, the second layer set includes the same materials as the first layer set. In some embodiments, the second layer set includes different materials from the first layer set. In some embodiments, the second layer set has a different number of layers than the first layer set. In some embodiments, the second layer set comprises different materials than the first layer set.

Method 100 continues with optional step 106 in which a barrier and anti-reflective coating (BARC) layer is formed over the second layer set. In some embodiments, step 106 is omitted and no BARC layer is formed. In some embodiments, the BARC layer is formed using a PVD, ALD, sputtering, CVD, spin-on coating, or other suitable process.

Method 100 continues with step 108 in which a photoresist layer is formed over the BARC layer. In some embodiments where step 106 is omitted, the photoresist layer is formed over the second layer set. In other embodiments where step 106 is omitted, the photoresist layer is formed to have a thickness greater than embodiments where step 106 is included in method 100.

FIG. 2A is a cross sectional view of a semiconductor device 200 after step 108 of method 100, in accordance with one or more embodiments. Semiconductor device 200 includes a substrate 202, an etch stop layer (ESL) 204 over substrate 202 and an ILD layer 206 over the ESL. In some embodiments, ESL 204 is omitted and ILD layer 206 is over substrate 202. A first layer set 208 is over ILD layer 206. First layer set 208 includes two layers, a first bottom layer 210 and a first top layer 212. In some embodiments, first layer set 208 includes more than two layers. In some embodiments, first layer set 208 includes a single layer. A second layer set 214 is over first layer set 208. Second layer set includes two layers, a second bottom layer 216 and a second top layer 218. In some embodiments, second layer set 214 includes more than two layers. In some embodiments, second layer set 214 includes a single layer. A BARC layer 220 is over second layer set 214. In some embodiments, BARC layer 220 is omitted. A photoresist layer 222 is over BARC layer 220. In some embodiments where BARC layer 220 is omitted, photoresist layer 222 is over second layer set 214.

In some embodiments, substrate 202 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, ESL 204 comprises silicon nitride (SiN), silicon oxynitride (SiON), silicon carbide (SiC), silicon carbon nitride (SiCN), boron nitride (BN), silicon boron nitride (SiBN), silicon carbon boron nitride (SiCBN), combinations thereof, or other suitable materials. In some embodiments, CESL 204 is formed by gas cluster ion beams (GCIBs), PVD, ALD, sputter, CVD, or other suitable processes. In some embodiments, ESL 204 is a contact etch stop layer (CESL).

In some embodiments, ILD layer 206 comprises silicon oxide and/or low-k dielectric materials with a dielectric constant less than about 4. In some embodiments, ILD layer 206 has a k value less than 3.5. In some embodiments, ILD layer 206 has a k value less than 2.5. Suitable low-k dielectric materials include fluorinated silica glass (FSG); carbon doped silicon oxide, BLACK DIAMOND® (Applied Materials of Santa Clara, Calif.), xerogel, aerogel, amorphous fluorinated carbon, parylene, bis-benzocyclobutenes (BCB), SILK® (Dow Chemical, Midland, Mich.), polyimide, porous polymeric materials, other suitable materials or combinations thereof. In some embodiments, ILD layer 206 is formed by high density plasma (HDP) deposition, sub-atmospheric pressure CVD (SACVD), low pressure CVD (LPCVD), ALD, plasma enhanced ALD (PEALD), plasma enhanced CVD (PECVD), monolayer deposition (MLD), plasma impulse CVD (PICVD), spin-on, or other suitable processes.

First layer set 208 comprises first top layer 210 and first bottom layer 212. In some embodiments, first top layer 210 comprises a silicon-rich photoresist material. In some embodiments, first top layer 210 comprises SiON, silicon oxycarbide (SiOC), silicon oxide (SiO), spin-on glass, SiN or other suitable materials. In some embodiments, first top layer 210 comprises a silicon rich organic compound. In some embodiments, the silicon rich organic compound has a silicon content of about 40 weight % or more. First top layer 210 has a thickness ranging from about 10 nanometers (nm) to about 20 nm. If the thickness of first top layer 210 is reduced below about 10 nm, the first top layer will be unintentionally removed during processing of layer(s) located above the first top layer, in some embodiments. If the thickness of first top layer 210 is greater than about 20 nm, an aspect ratio of an opening formed in the first top layer is unnecessarily increased and production costs increase due to longer etching times and greater material consumption, in some embodiments.

In some embodiments, first bottom layer 212 comprises a carbon-rich organic material. In some embodiments, first bottom layer 212 comprises an organic material, spin-on carbon, SiON, or other suitable materials. In some embodiments, first bottom layer 212 comprises a non-chemically amplified polymethylmethacrylate (PMMA). In some embodiments, first bottom layer 212 is thicker than first top layer 210. First bottom layer 212 has a thickness ranging from about 30 nm to about 100 nm. If the thickness of first bottom layer 212 is less than about 30 nm, the first bottom layer will be removed prior to completion of etching ILD layer 206 which would increase a critical dimension of features formed in the ILD layer, in some embodiments. If the thickness of first bottom layer 212 is greater than about 100 nm, the aspect ratio of an opening in the first bottom layer increases and the critical dimension of the features formed in ILD layer 206 becomes more difficult to control, in some embodiments. In some embodiments, the thickness of first bottom layer 212 ranges from about 50 nm to about 100 nm to provide more precise control of the critical dimension of features formed in ILD layer 206.

Second layer set 214 comprises second top layer 216 and second bottom layer 218. In some embodiments, second top layer 216 comprises a silicon-rich photoresist material. In some embodiments, second middle layer 216 comprises SiON, silicon oxycarbide (SiOC), silicon oxide (SiO), spin-on glass, SiN or other suitable materials. In some embodiments, second top layer 216 comprises a silicon rich organic compound. In some embodiments, the silicon rich organic compound has a silicon content of about 40 weight % or more. In some embodiments, second top layer 216 comprises the same material as first top layer 210. In some embodiments, second top layer 216 comprises a different material from first top layer 210. Second top layer 216 has a thickness ranging from about 10 nanometers (nm) to about 20 nm. If the thickness of second top layer 216 is reduced below about 10 nm, the second top layer will be unintentionally removed during processing of layer located above the second middle layer, in some embodiments. If the thickness of top middle layer 216 is greater than about 20 nm, an aspect ratio of an opening formed in the top middle layer is unnecessarily increased and production costs increase due to longer etching times and greater material consumption, in some embodiments. In some embodiments, second top layer 216 has the same thickness as first top layer 210. In some embodiments, the thickness of second top layer 216 is different from first top layer 210.

In some embodiments, second bottom layer 218 comprises a carbon-rich organic material. In some embodiments, second bottom layer 218 comprises an organic material, spin-on carbon, SiON, or other suitable materials. In some embodiments, second bottom layer 218 comprises a non-chemically amplified PMMA. In some embodiments, second bottom layer 218 comprises the same material as first bottom layer 212. In some embodiments, second bottom layer 218 comprises a different material from first bottom layer 212. Second bottom layer 218 has a thickness ranging from about 30 nm to about 100 nm. If the thickness of second bottom layer 218 is less than about 30 nm, the second bottom layer will be removed prior to completion of opening of first middle layer 210, in some embodiments. Removing second bottom layer 218 prior to completion of opening first top layer 210 would increase a critical dimension of features formed in ILD layer 206 due to lack of precision in an etching mask formed by the first top layer and first bottom layer 212. If the thickness of second bottom layer 218 is greater than about 100 nm, the aspect ratio of an opening in the second bottom layer increases and the critical dimension of the features formed in ILD layer 206 become difficult to control, in some embodiments. In some embodiments, the thickness of second bottom layer 218 ranges from about 30 nm to about 60 nm to reduce the aspect ratio of the second bottom layer during an opening of first top layer 210 and more precisely control the critical dimension of features in ILD layer 206. In some embodiments, the thickness of second bottom layer 218 is the same as first bottom layer 212. In some embodiments, the thickness of second bottom layer 218 is different from first bottom layer 212.

BARC layer 220 reduces reflection of light during a lithography process to increase the precision of patterns formed in photoresist layer 222. BARC layer 220 also acts as a mask layer for opening second layer set 214. In some embodiments, BARC layer 220 comprises an organic material. In some embodiments, BARC layer 220 comprises a polymer material having a carbon ratio of greater than 80% by weight. In some embodiments, BARC layer 220 comprises SiON. In some embodiments, BARC layer 220 is formed by spin-on coating. In some embodiments, BARC layer 220 is formed by CVD, PVD, ALD, or other suitable processes. BARC layer 220 has a thickness ranging from about 10 nm to about 30 nm. If the thickness of BARC layer 220 is below about 10 nm, then the BARC layer is removed during a subsequent de-scum process thereby preventing the BARC layer from acting as a mask during the etching of second layer set 214, in some embodiments. If the thickness of BARC layer 220 is greater than about 30 nm, production costs are increased as a result of unnecessary consumption of material and increased processing time to form an opening in the BARC layer, in some embodiments.

Photoresist layer 222 is used to define a pattern to be transferred to ILD layer 206 through BARC layer 220, second layer set 214 and first layer set 208. Photoresist layer 222 comprises either a positive photoresist material or a negative photoresist material. In some embodiments, photoresist layer 222 is an extreme ultraviolet (EUV) photoresist material. In some embodiments, photoresist layer 222 is a deep ultraviolet (DUV) photoresist material. In some embodiments, photoresist layer 222 comprises an organic or inorganic polymer having a molecular weight ranging from about 2,000 to about 20,000. In some embodiments, photoresist layer 222 has a thickness ranging from about 35 nm to about 50 nm. The thickness of photoresist layer 222 is greater than the thickness of BARC layer 220. If the thickness of photoresist layer 222 is less than about 35 nm, the photoresist layer will be removed during opening of BARC layer 220, which results in inaccurate transfer of the pattern of the photoresist layer to ILD layer 206, in some embodiments. If the thickness of photoresist layer 222 is greater than about 50 nm, production costs are increased as a result of unnecessary consumption of material and increased processing time to pattern and open the photoresist layer, in some embodiments.

Returning to FIG. 1, method 100 continues with step 110 in which the photoresist layer is patterned and an opening is formed in the photoresist layer. The photoresist layer is patterned using a lithography process. In some embodiments, the lithography process is an EUV lithography process which involves light emitted at a wavelength of approximately 13.5 nm. The small wavelength of the EUV light enables a denser patterning of the photoresist layer in comparison with light having longer wavelengths. The increased pattern density reduces the critical dimension of the semiconductor device and facilitates technology node shrinkage. In some embodiments, the lithography process is a deep ultraviolet (DUV) lithography process which involves light emitted at a wavelength ranging from about 193 nm to about 248 nm. The DUV lithography process facilitates a lower LWR parameter than processes involving light having a shorter wavelength.

The opening in the photoresist layer is formed by etching the patterned photoresist layer to form a mask for the underlying layers. The etching process is either a wet etching or a dry etching process. In some embodiments, an etchant used during the photoresist layer etching process is tetrafluoromethane ($CF_4$).

FIG. 2B is a cross sectional view of semiconductor device 200 following step 110, in accordance with one or more embodiments. An opening 224 is formed in photoresist layer 222. Opening 224 corresponds to a pattern to be transferred to ILD layer 206 during subsequent processing. Opening 224 exposes a portion of BARC layer 220 below photoresist layer 222.

Method 100 continues with step 112 in which a de-scum process is performed and the BARC layer is opened. The de-scum process removes any trace amounts of photoresist layer in the opening formed in step 110. The de-scum process includes bombarding an exposed surface of the BARC layer with plasma ions to discharge charges built up in the BARC layer during processing of the photoresist layer. In some embodiments, a supply gas for the plasma ions is nitrogen ($N_2$), oxygen ($O_2$), argon (Ar), or other suitable gases. In some embodiments, the de-scum process has an oxygen gas flow rate ranging from about 50 standard cubic centimeters per minute (sccm) to about 100 sccm, a plasma power ranging from about 0.6 kilowatts (kW) to about 1.0 kW, a plasma frequency ranges from about 13.46 Hertz (Hz) to about 13.66 Hz, and a pressure ranging from about 30 miliTorr (mTorr) to about 60 mTorr.

The de-scum process will remove at least a portion of the exposed BARC layer. Any remaining portion of the exposed BARC layer is then removed by etching to form an opening in the BARC layer. The etching process is either a wet etching or a dry etching process. In some embodiments, $CF_4$ is used as an etchant to form the opening in the BARC layer.

In embodiments which do not include step 106, the de-scum process is performed on a surface of the second layer set. In an embodiment which does not include step 106, the opening of the BARC layer is omitted from step 112.

FIG. 2C is a cross sectional view of semiconductor device 200 following step 112, in accordance with one or more embodiments. An opening 226 extends through photoresist layer 222 and BARC layer 220 to expose a portion of second layer set 214. In the embodiment of FIG. 2C, a portion of second top layer 218 is exposed by opening 226.

Method 100 continues with step 114 in which the second layer set is etched to form an opening. The etching process transfers the pattern of the BARC layer to the second layer set. The etching process also removes the photoresist layer and the BARC layer to expose a top surface of the second layer set. The etching process is a wet etching or dry etching process. In some embodiments where the second layer set includes a plurality of layers, a different etching process is used for at least one of the layers of the second layer set. In some embodiments, a single etching process is used to etch the entire second layer set. In some embodiments, an etchant is used for forming the opening in the second layer set is $CF_4$. In some embodiments, the $CF_4$ etchant is mixed with trifluoromethan ($CHF_3$) or difluoromethane ($CH_2F_2$) for more precise control of the dimensions of the opening. In some embodiments, the etchant used for forming the opening in the second layer set comprises a mixture of carbonyl sulfide (COS), $O_2$, $N_2$ and Ar. In some embodiments, a flow rate of COS ranges from about 5 standard cubic centimeters per minute (sccm) to about 50 sccm, a flow rate of $O_2$ ranges from about 2 sccm to about 150 sccm, a flow rate of $N_2$ ranges from about 100 sccm to about 300 sccm and a flow rate of Ar ranges from about 100 sccm to about 300 sccm. In some embodiments, the etchant used for forming the opening in the second layer set is a mixture containing $N_2$ and another gas such as hydrogen ($H_2$), carbon dioxide ($CO_2$), carbon monoxide (CO) or other suitable materials.

The etching process forms a tapered opening in the second layer set. The tapered opening is wider at a side of the second layer set farthest from the ILD layer. In some embodiments, an angle θ1 (FIG. 2D) between a sidewall of the tapered opening and a top surface of the first layer set ranges from about 85-degrees to about 90-degrees, but less than 90-degrees. If the angle is less than about 85-degrees, the aspect ratio of the second layer set increases the difficulty of etching the first layer set during a subsequent etching process, in some embodiments. If the angle is equal to or greater than 90-degrees, the tapered opening is wider at an interface of the second layer set and the first layer set which increases dimensions of the opening formed during subsequent etching of the first layer set, in some embodiments. The increased dimensions of the opening will increase the critical dimension of the semiconductor device.

FIG. 2D is a cross sectional view of semiconductor 200 following step 114, in accordance with some embodiments. The etching process forms an opening 228 in second layer set 214 and exposes a portion of first layer set 208. The etching process of step 114 also removes photoresist layer 222 and BARC layer 224. Sidewalls of opening 228 are tapered such that opening 228 is wider at a top surface of second layer set 214 furthest from ILD layer 206. An angle $θ_1$ between the sidewalls of opening 228 and a top surface of first top layer 210 ranges from about 85-degrees to about 90-degrees, but less than 90-degrees. In the embodiment of FIG. 2D, an etchant used to etch second top layer 218 is $CF_4$ and an etchant used to etch second bottom layer 216 is the mixture of COS, $O_2$, $N_2$ and Ar.

Method 100 continues with step 116 in which an opening is formed in the first layer set. The etching process transfers the pattern of the second layer set to the first layer set. The suitable etchants used to form the opening in the first layer set are similar to the etchants used in step 114. In some embodiments, the etching process removes a portion of the second layer set. The etching process is a wet etching or dry etching process. In some embodiments where the first layer set includes a plurality of layers, a different etching process is used for at least one of the layers of the first layer set. In some embodiments, a single etching process is used to etch the entire first layer set. In some embodiments, the opening in the first layer set is tapered. In some embodiments, the opening in the first layer set is vertical. In some embodiments, the etching process used to form the opening in the first layer set is the same as the etching process used to form the opening in the second layer set. In some embodiments, the etching process used to form the opening in the first layer set is different from the etching process used to form the opening in the second layer set.

FIG. 2E is a cross sectional view of semiconductor device 200 following step 116, in accordance with some embodiments. The etching process forms an opening 230 through first layer set 208. The etching process of step 116 also removes second top layer 218. In some embodiments, sidewalls of opening 230 are tapered such that opening 230 is wider at a top surface of first layer set 208 farthest from ILD layer 206. In some embodiments, the sidewalls of opening 230 are vertical, i.e., opening 230 has a constant width. An angle $θ_2$ between the sidewalls of opening 230 and a top surface of ILD layer 206 ranges from about 85-degrees to about 90-degrees. In some embodiments where opening 230 is tapered, angle $θ_1$ is the same as angle $θ_2$. In some embodiments where opening 230 is tapered, angle $θ_1$ is different from angle $θ_2$. In some embodiments, an etchant used to etch first top layer 212 and first bottom layer 210 are the same etchants used to etch second top layer 218 and second bottom layer 216, respectively.

In the embodiment of FIG. 2E, an etchant used to etch first top layer 210 is $CF_4$ and an etchant used to etch first bottom layer 212 is the mixture of COS, $O_2$, $N_2$ and Ar. In some embodiments, an etching recipe used to etch first top layer 212 comprises about 80 sccm to about 120 sccm of $CF_4$ and about 10 sccm to about 50 sccm of $CHF_3$ along with dichloro-silane (DCS). In some embodiments, an etching recipe used to etch first top layer 212 comprises about 100 sccm of $CF_4$ along with DCS. The etching recipe which includes $CHF_3$ provides a more tapered profile of opening 230 in first top layer 212, than the recipe without $CHF_3$. In some embodiments, the etching process for first top layer 212 is carried out under a pressure of about 10 mTorr to about 80 mTorr, a source power ranging from about 200 Watts (W) to about 400 W, and a bias power ranging from about 0 W to about 50 W. In some embodiments, an etching recipe used to etch first bottom layer 210 comprises a flow rate of COS ranges from about 5 standard cubic centimeters per minute (sccm) to about 50 sccm, a flow rate of $O_2$ ranges from about 2 sccm to about 150 sccm, a flow rate of $N_2$ ranges from about 100 sccm to about 300 sccm and a flow rate of Ar ranges from about 100 sccm to about 300 sccm. In some embodiments, an etching recipe used to etch first bottom layer 210 comprises about 20 sccm of COS, about 20 sccm of $O_2$, about 200 sccm of $N_2$ and about 200 sccm of Ar. In some embodiments, the etching process for first bottom layer 210 is carried out under a pressure of about 5 mTorr to about 30 mTorr, a source power ranging from about 400 W to about 800 W, and a bias power ranging from about 0 W to about 50 W.

The inventors believe the COS in the etchant acts to provide a degree of protection for sidewalls of opening 230. The protection of the sidewalls of opening 230 causes an etching rate in a direction perpendicular to the top surface of ILD layer 206 to be greater than an etching rate in a direction parallel to the top surface of the ILD layer. The result is tapered opening 230.

The tapered opening helps to increase uniformity in openings formed in ILD layer 206 by decreasing an aspect ratio of opening 230 at a top portion of the opening. The decreased aspect ratio helps etchant reach the top surface of ILD layer 206 during subsequent processing. By increasing the amount of etchant reaching the top surface of ILD layer 206, the processing time for the subsequent etching of the ILD layer decreases. The decreased processing time in turn lead to less etching of the sidewalls of opening 230, so that a constant width is imparted to the opening formed in ILD layer 206.

A width of opening 230 adjacent to ILD 206 is determined by the critical dimension of the lithography process and a size of a feature formed in ILD 206. A lithography process having a shorter wavelength enables formation of features having a smaller critical dimension resulting in a smaller width for opening 230. A width of opening 230 adjacent first top layer 212 depends on the width of opening 230 adjacent ILD 206 and a thickness of first bottom layer 210. A width difference between the width of opening 230 adjacent first top layer 212 and the width of opening 230 adjacent ILD 206 is independent of the critical dimension or the size of the feature formed in ILD 206. The width difference ranges, for example, from substantially zero, where angle $\theta_2$ is close to 90-degrees regardless of the thickness of first bottom layer 210, to 17.48 nanometers, where angle $\theta_2$ is 85-degrees and the thickness of first bottom layer 210 is 100 nm.

For example, if a width of opening 230 adjacent to ILD 206 is 28 nanometers and the thickness of first bottom layer 210 is 100 nanometers, the width of opening 230 adjacent first top layer 212 ranges from 28 nanometers to 45.48 nanometers. As the thickness of first bottom layer 210 decreases, the width difference also decreases for angles less than 90-degrees. For example, if a width of opening 230 adjacent to ILD 206 is 28 nanometers and the thickness of the first bottom layer 210 is 30 nanometers, the width of opening 230 adjacent first top layer 212 ranges from 28 nanometers to 33.24 nanometers. In the above example, a percent change of the width of opening 230 ranges from 18.7%, where the thickness of first bottom layer 210 is 30 nanometers, to 62.4%, where the thickness of the first bottom layer is 100 nm.

Method 100 continues with step 118 in which a feature is etched into the ILD layer. The etching process transfers the pattern of the first layer set to the ILD layer. The etching process removes at least a portion of the first layer set. The etching process is a wet etching or dry etching process. In some embodiments, the etching process is a two-step etching process. A first etching includes etching an upper portion of the ILD layer with an etchant having low etching selectivity and a high etch rate. A second etching includes etching a lower portion of the ILD layer with an etchant having a higher selectivity and a lower etch rate. The two step etching process allows faster processing time in comparison with a process using only the highly selective etchant. The two step etching process also reduces the risk of over etching the ILD layer and damaging underlying layers in comparison with an etching process using only the low selectivity etchant. In some embodiments, an etchant used in the first etching is $CF_4$, which will also remove portions of the first layer set. In some embodiments, an etchant used in the second etching is hexa-fluoro-butadiene ($C_4F_6$).

FIG. 2F is a cross sectional view of semiconductor device 200 following step 118, in accordance with some embodiments. The etching process forms an opening 232 through ILD layer 206. The etching process of step 118 also removes first top layer 212 and at least a portion of first bottom layer 210. Sidewalls of opening 232 are substantially vertical, such that a width of opening 232 is constant from the top surface of ILD layer 206 to a bottom surface of the ILD layer.

Method 100 continues with optional step 120 in which ashing is performed to remove any remaining portion of the first layer set to expose the top surface of the ILD layer. In some embodiments, the etching of step 118 will completely remove the first layer set and step 120 is omitted. In some embodiments, the etching of step 118 does not completely remove the first layer set and the remaining portion of the first layer set is removed by ashing. The ashing uses oxygen-based plasma to remove the remaining portions of the first layer set. In some embodiments, the oxygen-based plasma is mixed with $N_2$, $H_2$, CO, $CO_2$, nitrogen oxide (NO), nitrogen dioxide ($NO_2$), ammonium ($NH_3$) or other suitable materials. The ashing process exposes the top surface of the ILD layer.

FIG. 2G is a cross sectional view of semiconductor device 200 following step 120, in accordance with some embodiments. The ashing process removes any remaining material of first bottom layer 210 to expose the top surface of ILD layer 206. Opening 232 in ILD layer 206 corresponds to either a trench or a via. Opening 232 has a LWR of less than about 3 nm. In embodiments where opening 230 has vertical sidewalls, the LWR of semiconductor device 200 produced by method 100 is less than about 3.0 nm. In embodiments wherein opening 230 has tapered sidewalls, the LWR of semiconductor device 200 produced by method 100 is less than about 2.5 nm. In some embodiments, the LWR of semiconductor device 200 produced by method 100 is less than about 2.0 nm.

Figure 3B:
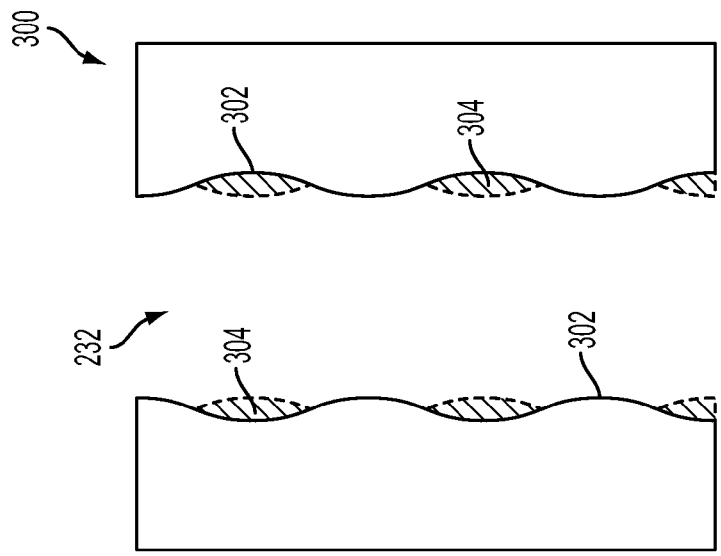
FIG. 3B is a cross section view of a via formed in an interlayer dielectric layer in accordance with one or more embodiments.
Figure 3A:
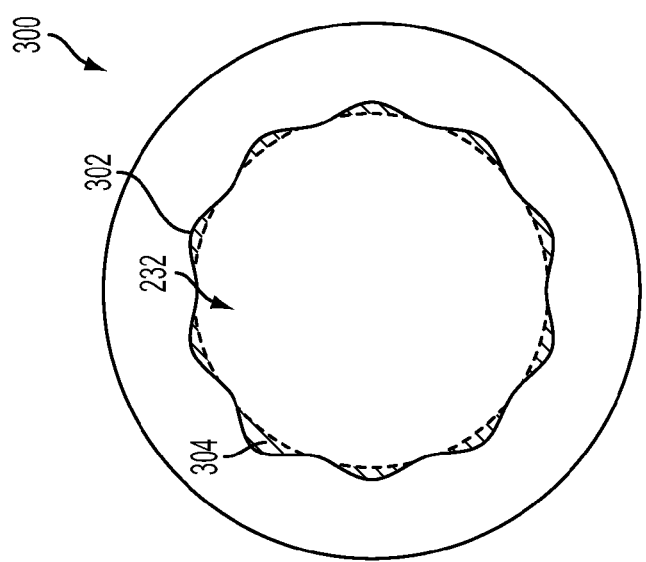
FIG. 3A is a top view of a via formed in an interlayer dielectric layer in accordance with one or more embodiments.

FIG. 3A is a top view of a via 300 formed in ILD layer 206 in accordance with one or more embodiments. Via 300 includes sidewalls 302. Sidewalls 302 are rough as a result of small process variations during the etching process of step 116. In some instances, recessed portions of sidewalls 302 are partially filled with by-product materials 304 which result from the etching process. By-product materials 304 are deposited within the recessed portions of sidewalls 302 during the etching process and the by-product materials reduce the roughness of opening 232. The inventors believe the angle of openings 228 and 230 helps to conduct by-product materials 304 into opening 232 which enables a higher degree of filling of the recessed portions of sidewalls 302. The resulting structure of opening 232 has a lower LWR in comparison with techniques which do not include the angle of openings 228 and 230.

FIG. 3B is a cross sectional view of via 300 formed in ILD layer 206 in accordance with one or more embodiments. The cross sectional view of via 300 shows that by-product materials 304 partially fill in recessed portions of sidewalls 302 along an entire depth of opening 232.

In some embodiments, additional processing steps such as metallization steps and chemical-mechanical polishing (CMP) steps are performed to form a final semiconductor device. In some embodiments, method 100 is repeated several times to form several different features in ILD layer 206. In some embodiments, a dual damascene process is used to form additional conductive lines and vias.

Method 100 is advantageous for production processes which utilize advance lithography processes, such as e-beam or EUV lithography. For example, EUV lithography experiences an increased LWR with respect to lithography processes using longer wavelengths. Additionally, processes designed for EUV lithography include thinner layers, which increases the risk of damage during cleaning processes or de-scum processes. These factors make controlling LWR during an EUV lithography process difficult. However, by tapering opening 224 in bottom layer 210, LWR of opening 226 in ILD 206 is effectively controlled to be less than about 3 nanometers.

One aspect of this description relates to a method of making a semiconductor device. The method includes forming an intermediate semiconductor device. The intermediate semiconductor device includes a substrate; and a dielectric layer over the substrate. The intermediate semiconductor device further includes a first layer set over the dielectric layer, wherein the first layer set comprises a silicon-rich photoresist material. The intermediate semiconductor device further includes a second layer set over the first layer set, wherein the second layer set comprises a plurality of layers including a carbon-rich organic material layer. The method further includes etching the second layer set to form a tapered opening in the second layer set, the tapered opening having sidewalls at an angle with respect to a top surface of the dielectric layer. The method further includes etching the first layer set to form an opening in the first layer set, wherein etching the first layer set comprises removing the carbon-rich organic material layer. The method further includes etching the dielectric layer using the first layer set as a mask to form an opening in the dielectric layer, wherein etching the dielectric layer comprises reducing a thickness of the first layer set.

Another aspect of this description relates to a method of making a semiconductor device. The method includes forming an intermediate semiconductor device. The intermediate semiconductor device includes a substrate; and a dielectric layer over the substrate. The intermediate semiconductor device includes a plurality of layer sets over the dielectric layer having a top-most layer set farthest from the dielectric layer and a bottom-most layer set closest to the dielectric layer. At least one of the top-most layer set or the bottom-most layer set includes a silicon-rich photoresist material layer, and a carbon-rich organic material layer. The intermediate semiconductor device further includes a photoresist layer over the plurality of layer sets. The method further includes forming an opening in the photoresist layer. The method further includes etching the top most layer set to form an opening in the at least one first layer set of the plurality of layer sets, wherein the opening in the top-most layer set is tapered, wherein etching the top-most layer set comprises forming the tapered opening having sidewalls at an angle with respect to a top surface of the dielectric layer ranging from about 85-degrees to less than 90-degrees. The method further includes etching each layer set of the plurality of layer sets other than the top most layer to form an opening in each of plurality of layer sets, wherein etching a layer set adjacent to the top most layer comprises removing the carbon-rich organic material layer, and the opening in each of the plurality of layer sets is tapered. The method further includes etching the dielectric layer to form an opening in the dielectric layer.

Still another aspect of this description relates to a method of making a semiconductor device. The method includes forming an intermediate semiconductor device. The intermediate semiconductor device includes a dielectric layer; and a first layer set over the dielectric layer, wherein the first layer set comprises a plurality of layers. The intermediate semiconductor device further includes a second layer set over the first layer set. The second layer set includes a silicon-rich photoresist material layer, and a carbon-rich organic material layer. The method further includes etching the second layer set to form a tapered opening in the second layer set, the tapered opening having sidewalls at an angle with respect to a top surface of the dielectric layer. The method further includes etching the first layer set to form an opening in the first layer set, wherein etching the first layer set comprises removing the carbon-rich organic material layer. The method further includes etching the dielectric layer using the first layer set as a mask to form an opening in the dielectric layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of making a semiconductor device, the method comprising:
    forming an intermediate semiconductor device, the intermediate semiconductor device comprising:
        a substrate;
        a dielectric layer over the substrate;
        a first layer set over the dielectric layer, wherein the first layer set comprises a silicon-rich photoresist material;
        a second layer set over the first layer set, wherein the second layer set comprises a plurality of layers including a carbon-rich organic material layer; and
    etching the second layer set to form a tapered opening in the second layer set, the tapered opening having sidewalls at an angle with respect to a top surface of the dielectric layer;
    etching the first layer set to form an opening in the first layer set, wherein etching the first layer set comprises removing the carbon-rich organic material layer; and
    etching the dielectric layer using the first layer set as a mask to form an opening in the dielectric layer, wherein etching the dielectric layer comprises reducing a thickness of the first layer set.

2. The method of claim 1, wherein forming the intermediate semiconductor device comprises having a barrier and anti-reflective coating (BARC) layer over the second layer set.

3. The method of claim 2, further comprising performing a de-scum process and an etching process to form an opening in the BARC layer.

4. The method of claim 1, wherein the etching the first layer set comprises forming a tapered opening in the first layer set.

5. The method of claim 4, wherein etching the dielectric layer comprises forming the opening in the dielectric layer having a line width roughness (LWR) of less than about 3 nanometers (nm).

6. The method of claim 1, wherein the forming the intermediate semiconductor device comprises forming the first layer set having a different composition than the second layer set.

7. The method of claim 1, wherein the forming the intermediate semiconductor device comprises forming the first layer set having a different thickness than the second layer set.

8. The method of claim 1, further comprising performing a photolithography process using a light source having an extreme ultraviolet (EUV) wavelength.

9. The method of claim 1, wherein etching the first layer comprises forming the opening in the first layer having a sidewall having an angle with respect to the top surface of the dielectric layer ranging from about 85-degrees to less than 90-degrees.

10. A method of making a semiconductor device, the method comprising:
    forming an intermediate semiconductor device, the intermediate semiconductor device comprising:
        a substrate;
        a dielectric layer over the substrate;
        a plurality of layer sets over the dielectric layer having a top-most layer set farthest from the dielectric layer and a bottom-most layer set closest to the dielectric layer, wherein at least one of the top-most layer set or the bottom-most layer set comprises:
            a silicon-rich photoresist material layer, and
            a carbon-rich organic material layer; and
        a photoresist layer over the plurality of layer sets;
    forming an opening in the photoresist layer;
    etching the top most layer set to form an opening in the at least one first layer set of the plurality of layer sets, wherein the opening in the top-most layer set is tapered, wherein etching the top-most layer set comprises forming the tapered opening having sidewalls at an angle with respect to a top surface of the dielectric layer ranging from about 85-degrees to less than 90-degrees;
    etching each layer set of the plurality of layer sets other than the top most layer to form an opening in each of plurality of layer sets, wherein etching a layer set adjacent to the top most layer comprises removing the carbon-rich organic material layer, and the opening in each of the plurality of layer sets is tapered; and
    etching the dielectric layer to form an opening in the dielectric layer.

11. The method of claim 10, wherein forming the intermediate semiconductor device comprises having a barrier and anti-reflective coating (BARC) layer between the plurality of layer sets and the photoresist layer.

12. The method of claim 11, further comprising performing a de-scum process and an etching process using the photoresist layer as a mask to form an opening in the BARC layer.

13. The method of claim 10, wherein etching the dielectric layer comprises forming the opening in the dielectric layer having a line width roughness (LWR) of less than about 3 nanometers (nm).

14. The method of claim 10, wherein forming the intermediate semiconductor device comprises forming both the top-most layer set and the bottom-most layer set having a plurality of layers.

15. The method of claim 10, wherein the forming the intermediate semiconductor device comprises forming at least one of the plurality of layer sets having a different composition than another layer set of the plurality of layer sets.

16. The method of claim 10, wherein the forming the intermediate semiconductor device comprises forming at least one of the plurality of layer sets having a different thickness than another layer set of the plurality of layer sets.

17. The method of claim 10, wherein the forming the opening in the photoresist layer comprises performing a photolithography process using a light source having an extreme ultraviolet (EUV) wavelength.

18. A method of making a semiconductor device, the method comprising:
    forming an intermediate semiconductor device, the intermediate semiconductor device comprising:
        a dielectric layer;
        a first layer set over the dielectric layer, wherein the first layer set comprises a plurality of layers;
        a second layer set over the first layer set, wherein the second layer set comprises:
            a silicon-rich photoresist material layer, and
            a carbon-rich organic material layer; and
    etching the second layer set to form a tapered opening in the second layer set, the tapered opening having sidewalls at an angle with respect to a top surface of the dielectric layer;
    etching the first layer set to form an opening in the first layer set, wherein etching the first layer set comprises removing the carbon-rich organic material layer; and
    etching the dielectric layer using the first layer set as a mask to form an opening in the dielectric layer.

19. The method of claim 18, further comprising forming a barrier and anti-reflective coating layer over the second layer set.

20. The method of claim 18, further comprising performing an ashing process to remove at least a portion of the first layer after etching the dielectric layer using the first layer set as the mask to form the opening in the dielectric layer.

* * * * *